United States Patent [19]

Nakashiba

[11] Patent Number: 5,920,346
[45] Date of Patent: Jul. 6, 1999

[54] TWO-DIMENSIONAL CCD IMAGE SENSOR FREE FROM VERTICAL BLACK STREAKS

[75] Inventor: Yasutaka Nakashiba, Tokyo, Japan

[73] Assignee: NEC Corporation, Tokyo, Japan

[21] Appl. No.: 08/735,081

[22] Filed: Oct. 22, 1996

[30]     Foreign Application Priority Data

Oct. 25, 1995   [JP]   Japan ..................................... 7-302123

[51] Int. Cl.$^6$ ............................. H04N 3/14; H01L 27/148
[52] U.S. Cl. .......................... 348/315; 348/316; 257/232
[58] Field of Search .................................... 348/311, 315, 348/316, 248, 249, 250; 257/231, 232, 233, 240, 241, 249

[56]         References Cited

U.S. PATENT DOCUMENTS

| 4,669,100 | 5/1987 | Slotboom et al. | 257/231 |
| 4,987,466 | 1/1991 | Shibata et al. | 257/231 |
| 5,323,034 | 6/1994 | Furumiya | 257/232 |
| 5,428,231 | 6/1995 | Tanaka et al. | 257/232 |
| 5,589,698 | 12/1996 | Nakashiba | 257/232 |

FOREIGN PATENT DOCUMENTS

| 63-211752 | 9/1988 | Japan . |
| 6-314706 | 11/1994 | Japan . |
| 7-161970 | 6/1995 | Japan . |

*Primary Examiner*—Wendy Garber
*Assistant Examiner*—Luong Nguyen
*Attorney, Agent, or Firm*—Young & Thompson

[57]            ABSTRACT

In a two-dimensional CCD image sensor, vertical transfer channels (6) are arranged to receive charge packets from a matrix array of photodiodes (1), and row electrodes (3) are connected to the vertical transfer channels for shifting the charge packets row by row along the vertical transfer channels. A horizontal transfer channel (14) has stages for receiving charge packets from corresponding vertical transfer channels (6). Each stage of the horizontal transfer channel is formed with first and second sets of a storage region (A1; A2) and two barrier regions (B1, C1; B2, C2) each. For each stage, a group of first, second, third and fourth adjoining electrodes (27, 28, 29, 30) is provided, the first and second electrodes being connected to receive a first phase clock pulse and the third and fourth electrodes being connected to receive a second, opposite phase clock pulse. The first and third electrodes (27-1, 29-1) respectively overlie the storage regions of the first and second sets (A1, A2), and the second and fourth electrodes (28-1, 30-1) respectively overlie the barrier regions of the first and second sets (B1, C1; B2, C2). In order to eliminate vertical black streaks, the barrier regions (B1, C1) of the first set are connected to a corresponding vertical transfer channel (6-1) to exclusively receive charge packets therefrom.

7 Claims, 4 Drawing Sheets

TWO-DIMENSIONAL CCD IMAGE SENSOR FREE FROM VERTICAL BLACK STREAKS

BACKGROUND OF THE INVENTION

1. Field of the Invention

The present invention relates to a two-dimensional CCD (charge-coupled device) image sensor.

2. Description of the Related Art

Conventional two-dimensional CCD image sensors comprise a plurality of vertical transfer channels arranged to receive charge packets from a matrix array of photodiodes, a plurality of row electrodes connected to the vertical transfer channels for shifting the charge packets row by row along the vertical transfer channels, and a horizontal transfer channel arranged to receive charge packets from the vertical transfer channels. The horizontal transfer channel is formed with a plurality of patterns of doped adjoining regions. Each pattern has a first and a second set of a storage region and two barrier regions. Groups of electrodes are successively arranged on the horizontal transfer channel. Each of the groups has first, second, third and fourth electrodes, and each of the electrodes partially overlaps adjacent electrodes with an insulation layer interposed therebetween. For shifting charge packets along the horizontal transfer channel, the first and second electrodes are connected in pair and the third and fourth electrodes are connected in pair, and the respective electrode pairs are driven by clock voltage pulses of opposite phases. The first and third electrodes of each group respectively overlie the storage regions of the first and second sets, the second electrode of the group overlies the barrier regions of the first set and partially overlaps the final row electrode with an insulating layer interposed therebetween, and the fourth electrode of the group overlies the barrier regions of the second set. In the prior art horizontal transfer channel, the storage region of the first set and one of the barrier regions of the first set are connected to a corresponding vertical transfer channel to receive charge packets therefrom.

However, when CCD image sensors were connected to respective video monitors, few vertical black streaks appeared on some of the monitor screens. The image sensors were considered to be the cause of the failure. Since the failure rate of the image sensors is substantial, there exists a need for eliminating the vertical black streaks.

SUMMARY OF THE INVENTION

It is therefore an object of the present invention to provide a two-dimensional CCD image sensor free from vertical black streaks.

The present invention is based on a discovery that in the prior art a deep potential well exists in some of the junction areas between vertical transfer channels and a horizontal transfer channel due to the presence of two equipotentially biased electrodes in each junction area and charge packets from some of the vertical transfer channels are trapped by the potential well.

The object of the present invention is obtained by the provision of a horizontal transfer channel where the second and third regions of each of the patterns are connected to a corresponding vertical transfer channel so that charge packets from the vertical transfer channel are exclusively received by the second and third regions to be shifted to the first region. With this arrangement, only one electrode is associated at each entry point of the horizontal transfer channel with each vertical transfer channel.

More specifically, the present invention provides a two-dimensional CCD image sensor comprising a matrix array of photodiodes, a plurality of vertical transier channels arranged to receive charge packets from the photodiodes, a plurality of row electrodes connected to the vertical transfer channels for shifting the charge packets row by row along the vertical transfer channels, and a horizontal transfer channel. The horizontal transfer channel has a plurality of stages to receive charge packets from corresponding vertical transfer channels. Each stage is formed with adjoining regions divided into first and second sets of a storage region and two barrier regions each. A plurality of electrode groups are provided corresponding respectively to the stages of the horizontal transfer channel. Each of the electrode groups has first, second, third and fourth adjoining electrodes. For shifting charge packets along the horizontal transfer channel, the first and second electrodes are connected together to receive a first phase clock pulse and the third and fourth electrodes are connected together to receive a second, opposite phase clock pulse. The first and third electrodes respectively overlie the storage regions of the first and second sets, the second and fourth electrodes respectively overlying the barrier regions of the first and second sets. According to the invention, the barrier regions of the first set are connected to a corresponding vertical transfer channel to exclusively receive charge packets therefrom.

BRIEF DESCRIPTION OF THE DRAWINGS

The present invention will be described in further detail with reference to the accompanying drawings, in which.

DETAILED DESCRIPTION

Figure 1:
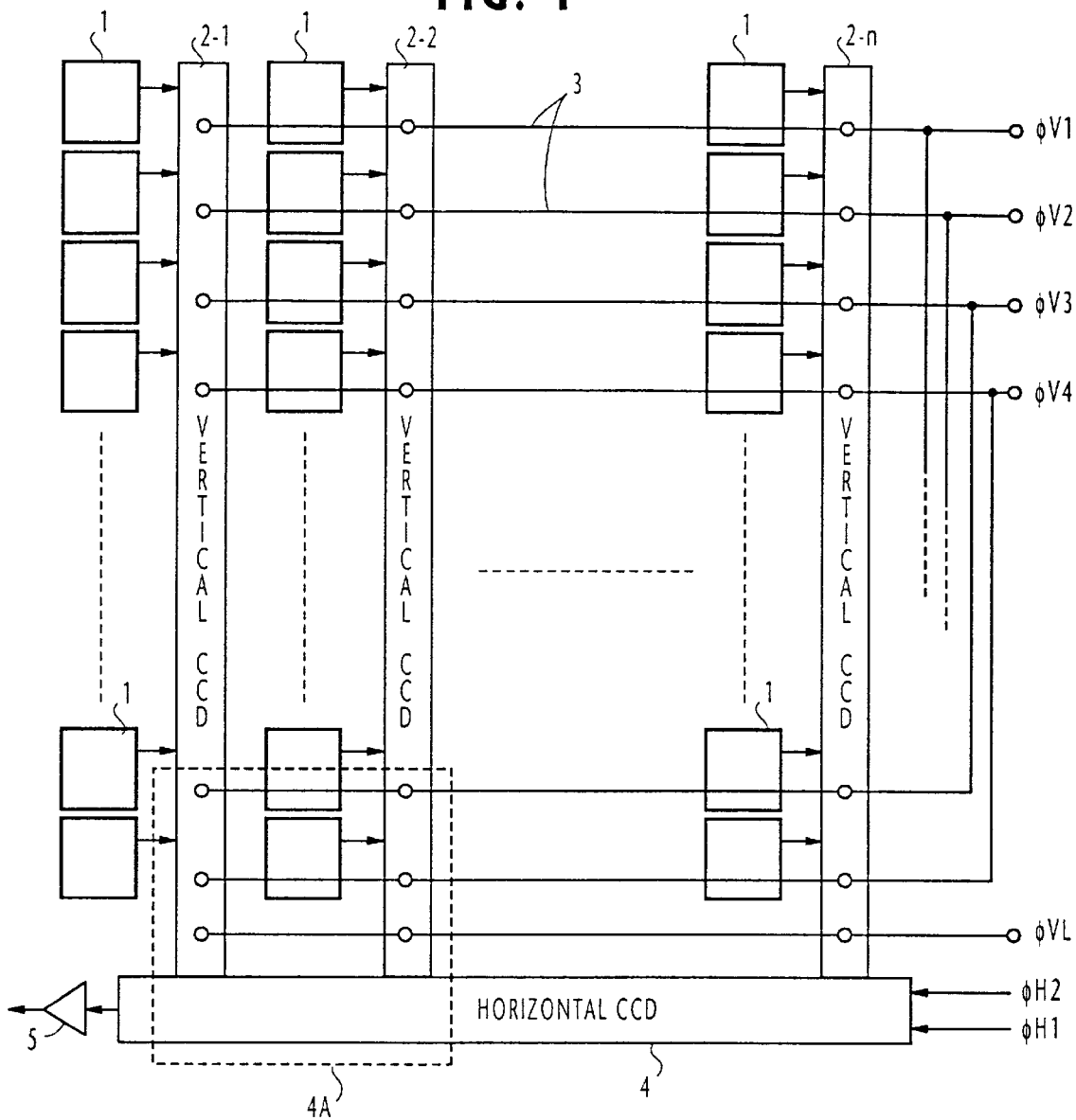
FIG. 1 is a block diagram of a two-dimensional CCD (charge-coupled device) image sensor.
Figure 2:
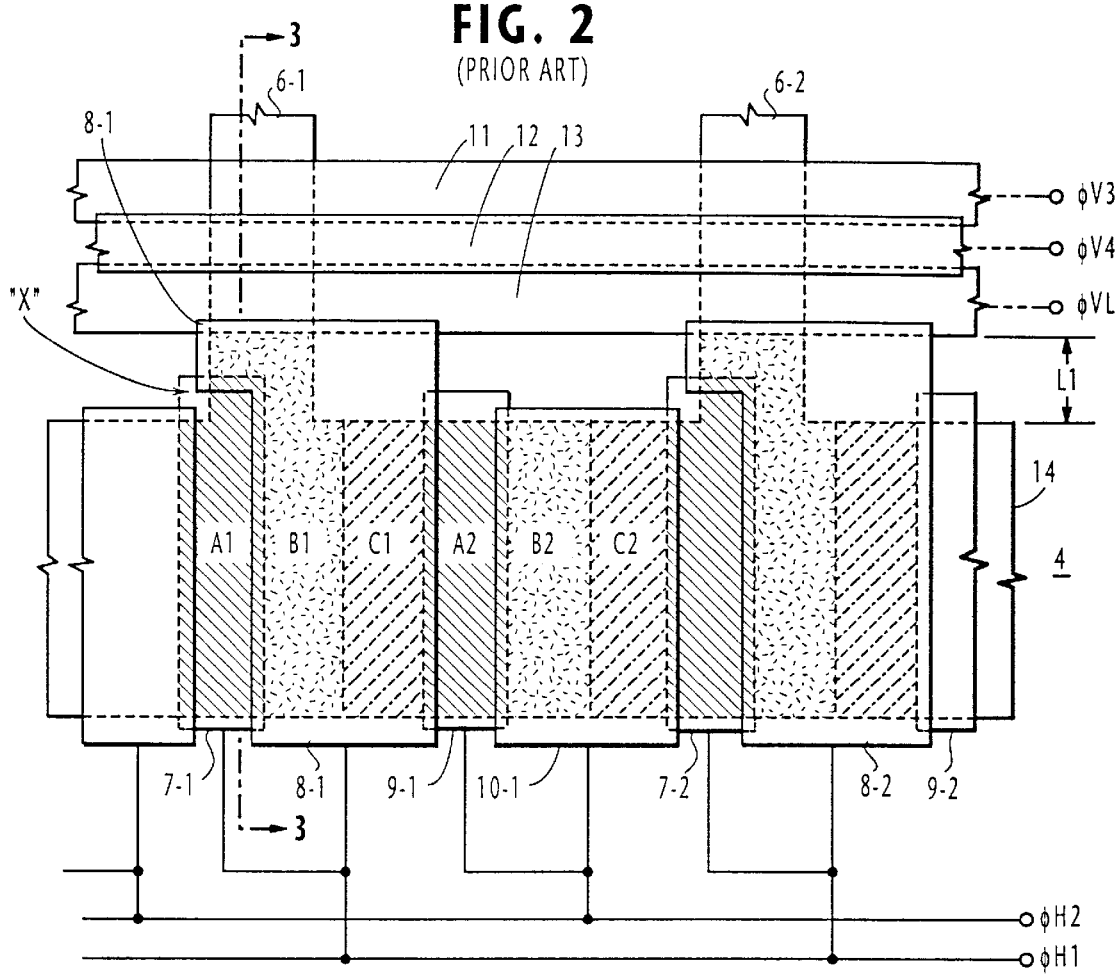
FIG. 2 is a plan view of a portion of a prior art two-dimensional CCD image sensor.
Figure 3:
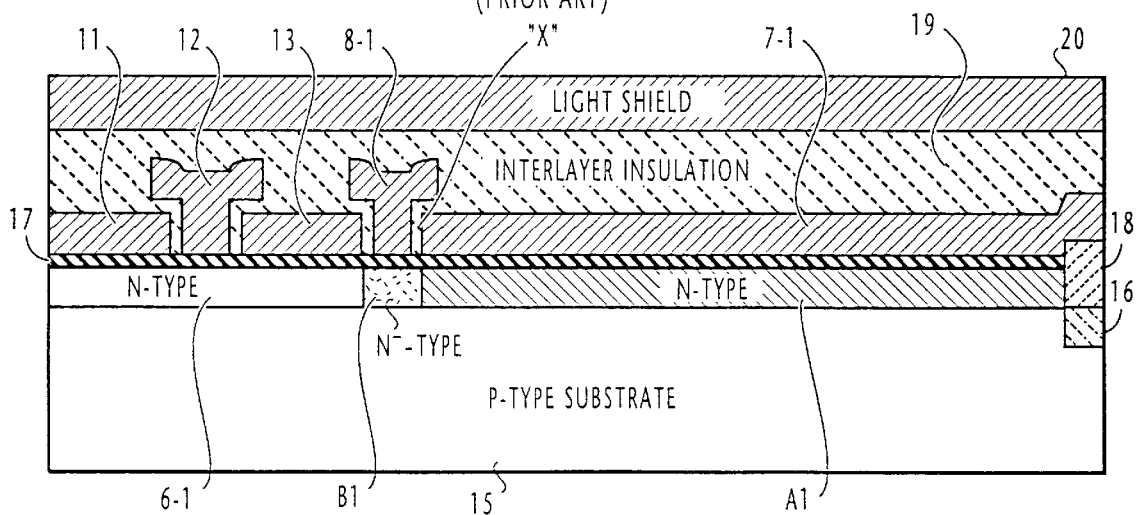
FIG. 3 is a cross-sectional view taken along the lines 3—3 of FIG. 2.

Before proceeding with the detailed description of the present invention, it may prove helpful to provide an explanation of the prior art with reference to FIGS. 1 to 4. In FIG. 1, a prior art two-dimensional CCD (charge-coupled device) image sensor has a matrix array of photodiodes 1 and a plurality of vertical shift registers, or vertical CCDs 2-1, 2-2, . . . , 2-n. Each vertical CCD is formed with a series of charge transfer cells. Transfer cells of corresponding rows are connected by row electrodes 3 to clock pulse terminals to which clock voltage pulses are supplied. During a vertical blanking period, an excitation pulse is applied to the transfer cells of given rows to receive electrical charges, or charge packets from the photodiodes 1. Application of subsequent four-phase clock voltage pulses φV1 to φV4 during each subsequent horizontal blanking period causes the charge packets of all vertical CCDs 2 to be shifted down their transfer channels so that the charge packets of bottom row are transferred to a horizontal shift register, or horizontal CCD 4. During a subsequent horizontal scan period, the charge packets in the horizontal CCD 4 are sequentially delivered through its transfer channel to an amplifier 5 in response to clock pulses φH1 and φH2 of opposite phases and applied to external circuitry, not shown. A portion of the vertical CCDs 2-1, 2-2 and the horizontal CCD 4 is enclosed by a dotted rectangle 4A and details of this portion are illustrated in FIGS. 2 and 3. The transfer channels of vertical CCDs 2-1 and 2-2 are of N-type conductivity and indicated by numerals 6-1 and 6-2, respectively. These vertical transfer channels 6 extend downwards and connect to the transfer channel 14 of the horizontal CCD 4, traversing row electrodes 11, 12 and 13. Note that the row electrode 13 is the final electrode to which a clock pulse φVL is applied. The horizontal transfer channel 14 has a plurality of repeated patterns of three different impurity doped regions including storage regions A of N-type conductivity, barrier regions B of N$^-$-type conductivity and barrier regions C of N$^{--}$-type conductivity. For each vertical transfer channel 6 there is a "charge transfer stage" where a group of six adjoining doped regions is provided. Each stage is divided into a first set of a storage region A1, and two barrier regions B1, C1, and a second set of a storage region A2, and barrier regions B2, C2, and each set corresponds to one of two opposite phases of clock voltage pulses. Note that, in each set, the provision of barrier region C is to prevent the backspilling of charge and the provision of barrier region B is to achieve high speed transfer of charge to storage region A. All elements of the CCD image sensor are formed on a P-type substrate 15.

In each junction area between a vertical transfer channel 6 and the horizontal transfer channel 14, storage region A1 and barrier region B1 extend upwards to the vertical transfer channel 6-1 and barrier region B1 further extends towards storage region A1 so that barrier region B1 exclusively contacts the lower end of vertical transfer channel 6-1.

All impurity doped regions are covered with a silicon dioxide insulating layer 17 on which polysilicon electrodes 11 to 13 are formed. Horizontal transfer electrodes 7 to 10 of polysilicon are also formed on the insulating layer 17 in such positions that storage regions A1 and A2 are overlaid with horizontal transfer electrodes 7-1 and 9-1, respectively, barrier regions B1, C1 with an electrode 8-1 and barrier regions B2, C2 with an electrode 10-1. Electrode 8-1 has a horizontally extending upper portion which partially overlaps the upper edge of electrode 7-1. In addition, the upper edge of electrode 8-1 partially overlaps the final row electrode 13 of the vertical CCDs. An interlayer insulating layer 19 is used to isolate these overlapping portions. Adjacent transfer electrodes 7 and 8 are connected together to receive clock pulses φH1 and adjacent transfer electrodes 9 and 10 are connected together to receive clock pulses φH2. The lower side of horizontal CCD 4 is defined with channel stops 16, 18 and the interlayer insulation layer 19 and a light shielding layer 20 are formed on the electrodes 7 to 10 of horizontal CCD 4 as well as on the row electrodes 11 to 13 of the vertical CCDs 2. Edges of each of the row electrodes and each of the horizontal transfer electrodes partially overlap adjacent electrodes and the spaces between the overlapping portions are filled with the insulation layer 19.

Figure 4:
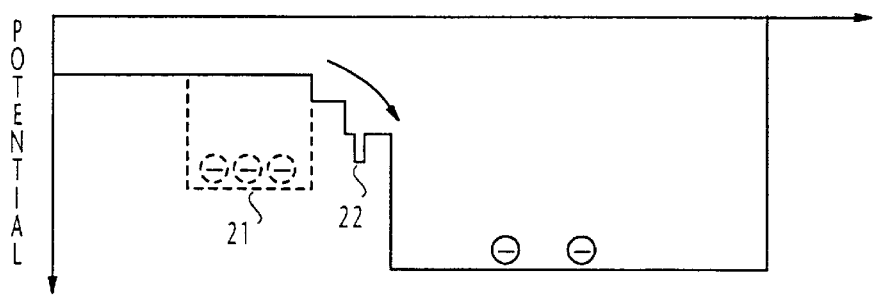
FIG. 4 is an illustration of a step potential profile of a junction area between a vertical transfer channel and a horizontal transfer channel of the prior art image sensor.

Therefore, in the prior art, two equipotentially biased electrodes (i.e., 7-1 and 8-1) are provided in the junction area between the vertical transfer channel 6-1 and the horizontal transfer channel 14. As a result, there is produced a potential difference between the final row electrode 13 on the one hand and the equipotentially biased electrodes 7-1 and 8-1 on the other, resulting in a field potential profile as shown in FIG. 4. Since the width of the vertical transfer channel 6 is narrow in comparison with its thickness, the profile is modified by, what is called the narrow channel effect such that it has a gradually varying gradient and this modified profile is generally called a "fringe field". Due to the presence of other potential differences produced by a gap between vertical transfer channel 6-1 and barrier region B1 and a gap between barrier region B1 and storage region A1, the potential stepwisely drops as charge packets move across these gaps, producing a staircase portion in the step potential profile as indicated in FIG. 4. When the final row electrode 13 is in an ON-state, the portion of vertical transfer channel 6-1 immediately beneath the final row electrode 13 is lower than the staircase portion of the profile and charge packets are stored in a potential well as indicated by a dotted line 21 in FIG. 4.

However, in the prior art CCD image sensor, a gap "X" is formed between the horizontally extending portion of transfer electrode 7-1 and the upper portion of transfer electrode 8-1 as clearly shown in FIG. 3. Since the gap "X" is filled with silicon dioxide and the electrodes 7-1 and 8-1 are at the same potential, a deep potential well 22 is formed in the staircase portion of the profile (FIG. 4). When the electrode 13 is switched to an OFF-state, the potential at the dotted region 21 is raised and the charge packets roll over the staircase portion into a lower potential region. Due to the presence of the deep potential well 22, the electric charges are partially trapped or prevented from smoothly rolling over to the lower potential region, thus resulting in a low charge transfer efficiency (hence, low transfer speed). In addition, because of very small quantities of charges that can be transferred from each vertical CCD 2 to the horizontal CCD 4 and because of manufacturing variability, the depth of potential wells 22 varies from one vertical-to-horizontal junction area to another in a CCD image sensor and varies from one CCD image sensor to another. Therefore, the resultant losses of charges by the deep potential well 22 in some CCD image sensors become pronounced so that they result in black vertical streaks on a monitor screen. In addition, due to the presence of two electrodes in each vertical-to-horizontal junction area, the spacing L1 between the final row electrode 13 and the upper edge of horizontal transfer channel 14 is substantial (see FIG. 2).

In order to overcome the prior art shortcomings, the present invention provides a two-dimensional CCD image sensor in which no deep potential well is created in the path of charge transfer from each vertical CCD to a horizontal CCD. Details of the corresponding portion 4A of the image sensor of this invention are illustrated in FIGS. 5 and 6.

Figure 5:
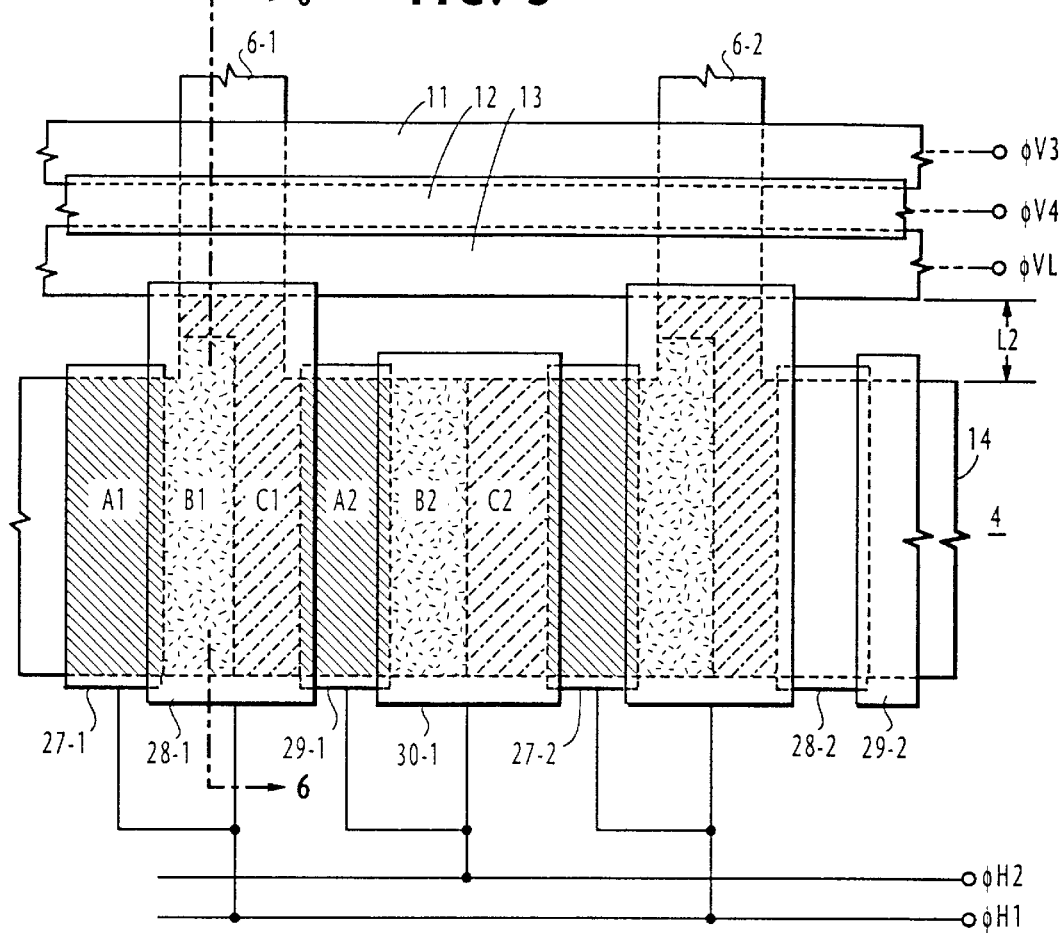
FIG. 5 is a plan view of a portion of a two-dimensional CCD image sensor according to a first embodiment of the present invention.
Figure 6:
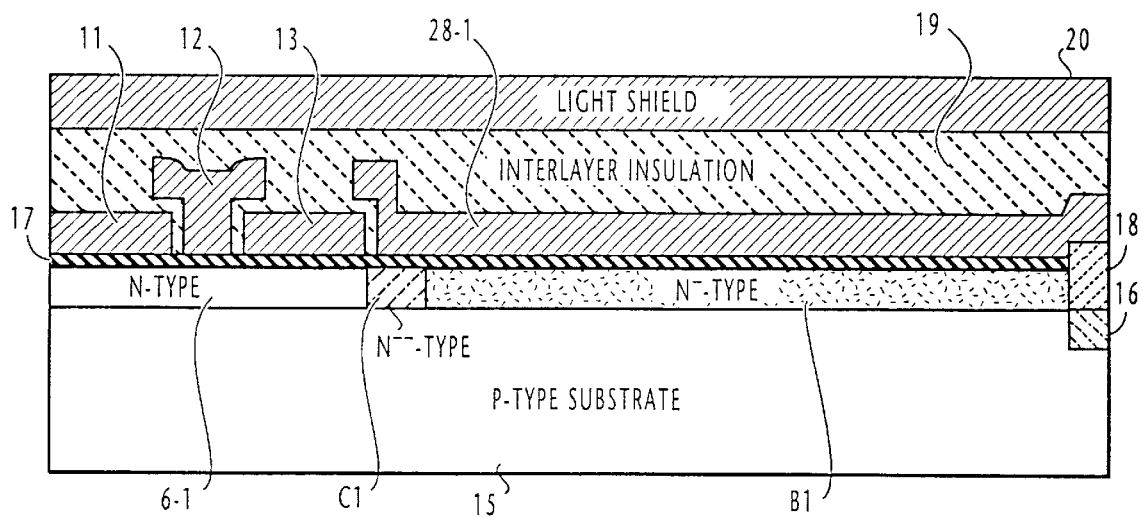
FIG. 6 is a cross-sectional view taleen along the lines 6—6 of FIG. 5.

In FIGS. 5 and 6, the transfer channels of vertical CCDs 2-1 and 2-2 are of N-type conductivity and indicated by numerals 6-1 and 6-2, respectively, in the same manner as in the prior art. Similar to the prior art, the horizontal transfer channel 14 of this invention has a plurality of repeated patterns of storage regions A of N-type conductivity (heavily doped), barrier regions B of N$^-$-type conductivity (medium doped) and barrier regions C of N$^{--}$-type conductivity (lightly doped), all of which are formed on a P-type substrate 15, and for each vertical transfer channel 6 there is a group of six adjoining regions A1, B1, C1, A2, B2 and C2.

In each group of six adjoining regions, barrier region C1 has an upwardly and horizontally extending portion adjacent an upwardly extending portion of barrier region B1 (FIG. 5) so that this portion of region C1 has the same width as that of vertical transfer channel 6-1 at the interface therebetween. Other regions A2, B2 and C2 are of substantially equal size and shape to each other.

All impurity concentration regions are covered with silicon dioxide insulating layer 17 on which polysilicon electrodes 11 to 13 are formed. Horizontal transfer electrodes (polysilicon) 27 to 30 of rectangular shape are formed on the insulating layer 17 in such positions that storage regions A1 and A2 are overlaid with horizontal transfer electrodes 27-1 and 29-1, respectively, barrier regions B1, C1 with an electrode 28-1 and barrier regions B2, C2 with an electrode 30-1. Vertically extending edges of each of these transfer electrodes partially overlap adjacent regions. The upper portion of electrode 28-1 partially overlaps the final row electrode 13 of the vertical CCDs. Adjacent transfer electrodes 27 and 28 are connected together to receive clock pulses φH1 and adjacent transfer electrodes 29 and 30 are connected together to receive clock pulses φH2.

Figure 7:
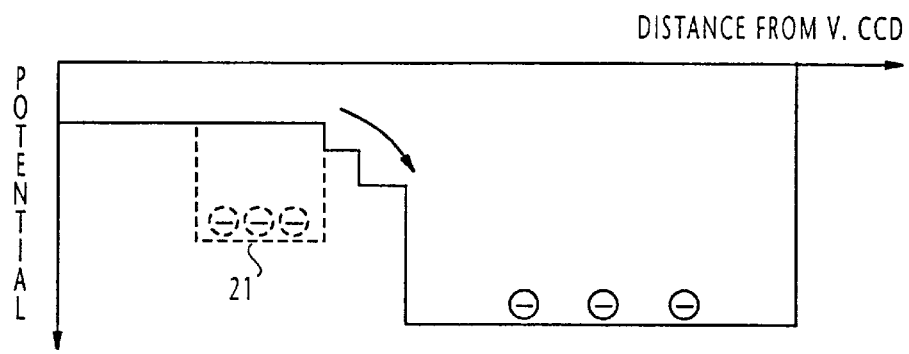
FIG. 7 is an illustration of a step potential profile of a junction area between a vertical transfer channel and a horizontal transfer channel of the first embodiment of the present invention.

It is seen that no gap is formed between equipotential electrodes in the path of charge packets at the entry to the horizontal channel 14. Thus, no potential well is formed in the staircase portion of the step potential profile as shown in FIG. 7. When the electrode 13 is switched to an OFF-state, the potential at the storage region 21 of the charge packets is raised and the charges roll over the staircase portion into the lower potential region. Due to the absence of a deep potential well, charges smoothly roll over the staircase portion without loss of charges. High charge transfer efficiency can also be achieved.

In addition, since there is only one electrode (i.e., 28-1) is provided in each vertical-to-horizontal junction area, the spacing "L2" between the final electrode 13 and the upper edge of horizontal transfer channel 14 can be made smaller than tie prior art spacing L1. Because of the narrow channel effect that occurs in the vertical-to-horizontal junction area, a fringe field is produced in this area. Due to the reduced spacing L2, this fringe field has, in effect, a steeper potential gradient than that of the prior art, thus accelerating charge packets in the vertical transfer channel 6 to enter the horizontal transfer channel at a higher speed.

For purposes of comparison tests, the CCD image sensors of the prior art and the present invention were made using a P-type substrate 15 with an impurity concentration of 1×1017 cm-3, a vertical transfer channel 6-1 of an impurity concentration 5×1017 cm-3, a barrier region B1 with an impurity concentration of 4.6×1017 cm-3, a barrier region C1 with an impurity concentration of 4.2×1017 cm-3, and an interelectrode insulation layer with a thickness of 0.25 micrometers. Experiments showed that approximately 70 percent of the prior art image sensors were found to exhibit vertical black streaks, while no vertical black streaks were found in the image sensors of the present invention.

Figure 8:
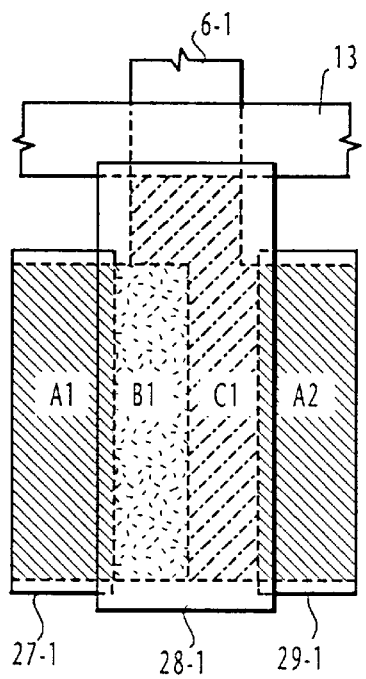
FIGS. 8 and 9 are plan views of modified embodiments of the present invention.
Figure 9:
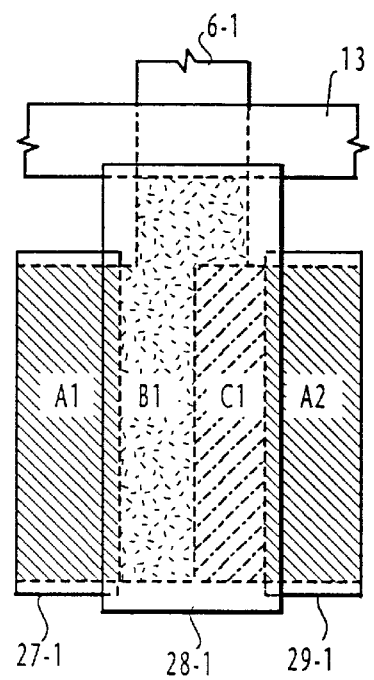
Figure 10:
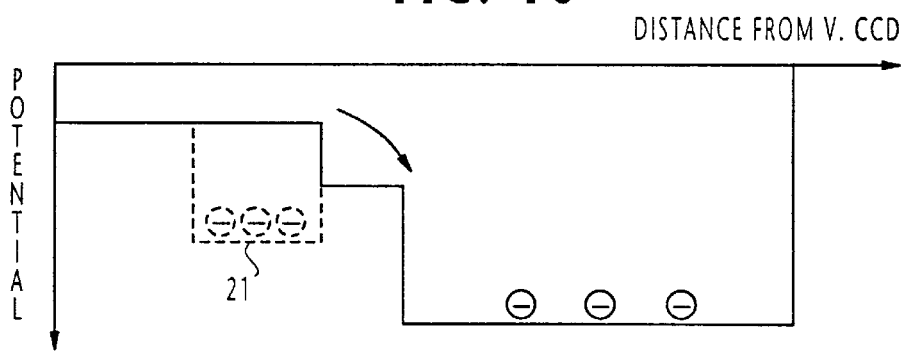
FIG. 10 is an illustration of a step potential profile of a junction area between a vertical transfer channel and a horizontal transfer channel of the modified embodiments of the present invention.

FIGS. 8 and 9 show modified forms of the present invention. In FIG. 8, the upper end of barrier region B1 is in line with the upper edge of horizontal transfer channel 14. The resulting potential profile has one step, instead of two of FIG. 7, as shown in FIG. 10. Alternatively, the barrier region B1 extends towards and exclusively contacts the vertical transfer channel 6-1 as shown in FIG. 9, while the upper end of barrier region C1 is in line with the upper edge of horizontal transfer channel 14. The potential profile of FIG. 9 is the same as that of FIG. 10. In these modifications, the spacing between the final electrode 13 and the upper edge of horizontal transfer channel 14 can be made smaller than the spacing L2.

What is claimed is:

1. A two-dimensional CCD (charge-coupled device) image sensor comprising:
   a matrix array of photodiodes;
   a plurality of vertical transfer channels arranged to receive charge packets from the photodiodes;
   a plurality of row electrodes connected to said vertical transfer channels for shifting said charge packets row by row along the vertical transfer channels;
   a horizontal transfer channel having a plurality of stages respectively corresponding to said vertical transfer channels to receive charge packets therefrom, each of said stages being formed with adjoining regions which are divided into first and second sets of a storage region and two barrier regions each, the barrier regions of the first set being connected to a corresponding one of said vertical transfer channels to exclusively receive charge packets therefrom, said two barrier regions being doped with different impurity concentrations; and
   a plurality of electrode groups corresponding respectively to the stages of the horizontal transfer channel, each of the electrode groups including first, second, third and fourth adjoining electrodes, said first and second electrodes being connected to receive a first phase clock pulse and said third and fourth electrodes being connected to receive a second, opposite phase clock pulse, the first and third electrodes overlying the storage regions of the first and second sets, respectively, and the second and fourth electrodes overlying the barrier regions of the first and second sets, wherein said first set barrier regions exclusively adjoin said one of said vertical transfer channels and said first set storage region is positioned disjoint from said one of said vertical transfer channels.

2. A two-dimensional CCD image sensor as claimed in claim 1, wherein the storage regions of the first and second sets are doped with high impurity concentration, the barrier regions of the first set are respectively doped with medium and low impurity concentrations and the barrier regions of the second set are respectively doped with medium and low impurity concentrations.

3. A two-dimensional CCD image sensor as claimed in claim 1, wherein the barrier regions of the first set include a portion that extends into the corresponding vertical transfer channel and the second electrode has a portion overlying the extended portion of said barrier regions of the first set.

4. A two-dimensional CCD image sensor as claimed in claim 1, wherein one of the barrier regions of the first set has a portion that extends into the corresponding vertical transfer channel and the second electrode has a portion overlying the extended portion of said one of the barrier regions of the first set.

5. A two-dimensional charge-coupled device image sensor comprising:
   a matrix array of photodiodes;
   a plurality of vertical transfer channels arranged to receive charge packets from the photodiodes;
   a horizontal transfer channel;
   a plurality of row electrodes connected to said vertical transfer channels for shifting said charge packets row by row along the vertical transfer channels;
   a junction region extending from said plurality of row electrodes to said horizontal transfer channels, each of said plurality of vertical transfer channels extending through said junction region to form a joining line at said horizontal transfer channel, said joining line being a width of said each of said plurality of vertical transfer channels;

said horizontal transfer channel having a plurality of stages respectively corresponding to said vertical transfer channels to receive charge packets therefrom, each of said stages being formed with adjoining regions which are divided into first and second sets of a storage region and two barrier regions each, the barrier regions of the first set being connected to a corresponding one of said vertical transfer channels along the entirety of the corresponding joining line to exclusively receive charge packets therefrom; and a plurality of electrode groups corresponding respectively to the stages of the horizontal transfer channel, each of the electrode groups including first, second, third and fourth adjoining electrodes, said first and second electrodes being connected to receive a first phase clock pulse and said third and fourth electrodes being connected to receive a second, opposite phase clock pulse, the first and third electrodes overlying the storage regions of the first and second sets, respectively, and the second and fourth electrodes overlying the barrier regions of the first and second sets.

6. The sensor of claim 5, wherein each of said storage region and two barrier regions of said first set are doped at a different one of a first, second, and third concentrations, said first concentration being greater than said second concentration and said second concentration being greater than said third concentration.

7. The sensor of claim 5, wherein one of said barrier regions of said first set extends into a portion of the corresponding vertical transfer channel within said junction region.

* * * * *